United States Patent
De Rapper et al.

(10) Patent No.: US 11,156,922 B2
(45) Date of Patent: Oct. 26, 2021

(54) METHOD AND DEVICE FOR DETERMINING THE HEATING STATE OF A MIRROR IN AN OPTICAL SYSTEM

(71) Applicant: Carl Zeiss SMT GmbH, Oberkochen (DE)

(72) Inventors: Willem Michiel De Rapper, Veldhoven (NL); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/081,255

(22) Filed: Oct. 27, 2020

(65) Prior Publication Data

US 2021/0041790 A1 Feb. 11, 2021

Related U.S. Application Data

(63) Continuation of application No. PCT/EP2019/061713, filed on May 7, 2019.

(30) Foreign Application Priority Data

May 30, 2018 (DE) .......................... 102018208653.2

(51) Int. Cl.
  *G03F 7/20* (2006.01)
  *G02B 7/18* (2021.01)
  *G02B 17/06* (2006.01)

(52) U.S. Cl.
  CPC ....... *G03F 7/70483* (2013.01); *G02B 7/1815* (2013.01); *G03F 7/70891* (2013.01); *G02B 17/0663* (2013.01)

(58) Field of Classification Search
  CPC .................. G02B 7/1815; G03F 7/70483; G03F 7/70891
  See application file for complete search history.

(56) References Cited

U.S. PATENT DOCUMENTS

| 10,161,808 B2 | 12/2018 | Vogt et al. |
| 2005/0140947 A1 | 6/2005 | Yoshikazu |

(Continued)

FOREIGN PATENT DOCUMENTS

| DE | 102010019113 A1 | 11/2011 |
| DE | 10 2010 041 528 | 3/2012 |

(Continued)

OTHER PUBLICATIONS

Translation of International Search Report for corresponding PCT Appl No. PCT/EP2019/061713, dated Aug. 29, 2019.

(Continued)

*Primary Examiner* — Steven Whitesell Gordon
(74) *Attorney, Agent, or Firm* — Fish & Richardson P.C.

(57) ABSTRACT

The disclosure provides a method and to an apparatus for determining the heating state of a mirror in an optical system, in particular in a microlithographic projection exposure apparatus. A method for determining the heating state of an optical element includes: measuring values of a first temperature that the optical element has at a first position using a temperature sensor; and estimating a second temperature that the optical element has at a second position, which is located at a distance from the first position, on the basis of the measured values, wherein estimating the second temperature is accomplished while taking into account a temporal change in the previously measured values.

20 Claims, 5 Drawing Sheets

(56) References Cited

U.S. PATENT DOCUMENTS

| | | | |
|---|---|---|---|
| 2006/0222044 A1* | 10/2006 | Melzer | G01J 1/4257 |
| | | | 374/45 |
| 2013/0176544 A1* | 7/2013 | Hauf | G02B 7/181 |
| | | | 355/30 |
| 2013/0186430 A1 | 7/2013 | Heinrich et al. | |
| 2013/0250266 A1 | 9/2013 | Bittner | |
| 2016/0026093 A1* | 1/2016 | Hauf | G03F 7/70308 |
| | | | 355/52 |

FOREIGN PATENT DOCUMENTS

| | | | | |
|---|---|---|---|---|
| DE | 102010061950 A1 | 5/2012 | | |
| DE | 10 2013 203 338 | 8/2014 | | |
| DE | 102015211167 A1 | 8/2015 | | |
| DE | 102015224281 A1 * | 9/2016 | | G02B 7/1815 |
| DE | 102016218746 A1 | 11/2016 | | |

OTHER PUBLICATIONS

Examination Report issued in related German Patent Application No. 10 2018 2018 653.2 dated Apr. 2, 2019, including English Translation, 7 pages.

Notification Concerning Transmittal of International Preliminary Report on Patentability (Chapter I of the Patent Cooperation Treaty) issued in related International Application No. PCT/EP2019/061713, dated Dec. 10, 2020, including English Translation, 16 pages.

* cited by examiner

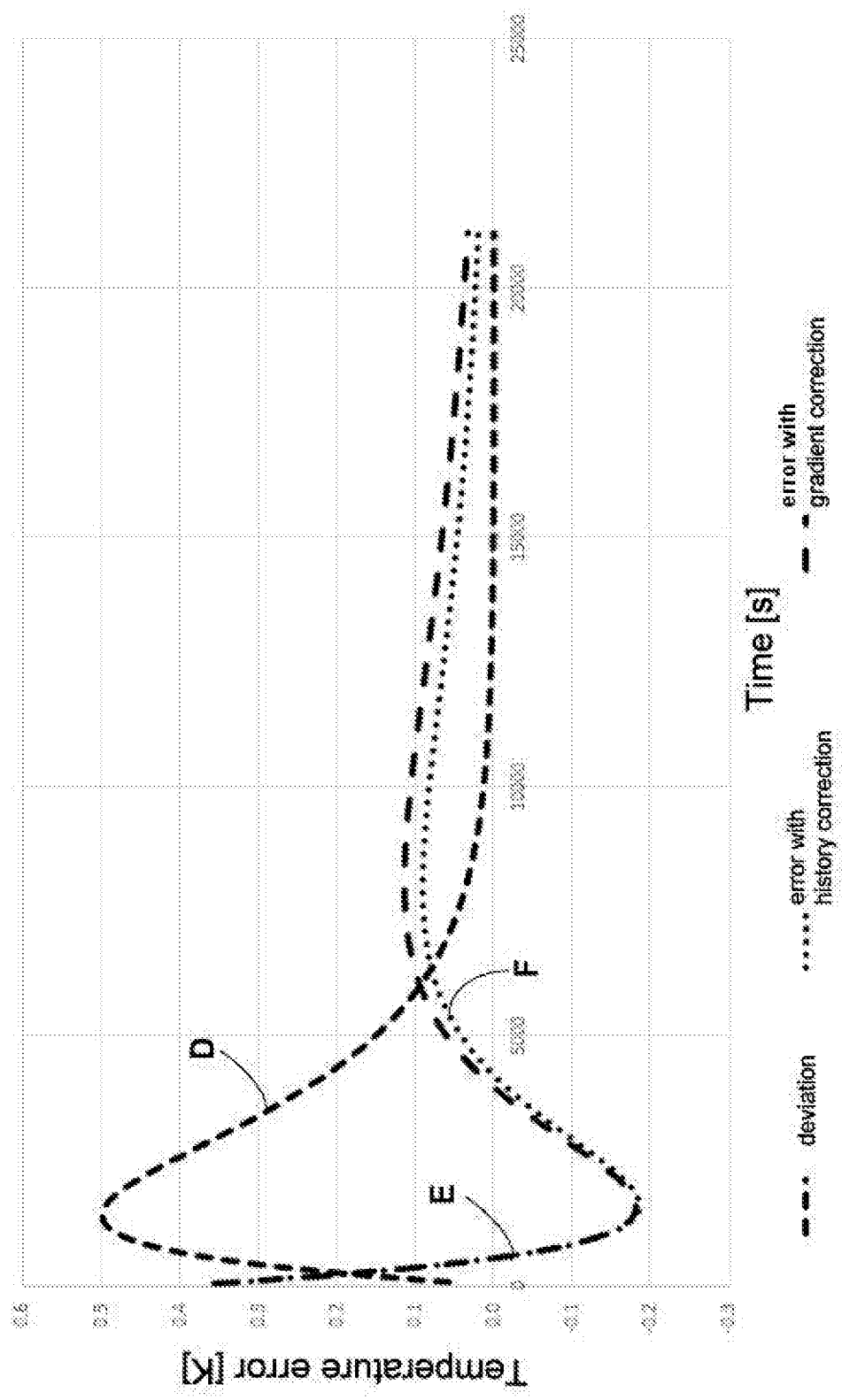

METHOD AND DEVICE FOR DETERMINING THE HEATING STATE OF A MIRROR IN AN OPTICAL SYSTEM

CROSS-REFERENCE TO RELATED APPLICATIONS

The present application is a continuation of, and claims benefit under 35 USC 120 to, international application PCT/EP2019/061713, filed May 7, 2019, which claims benefit under 35 USC 119 of German Application No. 10 2018 208 653.2, filed on May 30, 2018. The entire disclosure of these applications are incorporated by reference herein.

FIELD

The disclosure relates to a method and to an apparatus for determining the heating state of a mirror in an optical system, in particular in a microlithographic projection exposure apparatus.

BACKGROUND

Microlithography is used for the production of microstructured components, such as for example integrated circuits or LCDs. The microlithography process is conducted in what is called a projection exposure apparatus, which comprises an illumination device and a projection lens. The image of a mask (=reticle) illuminated via the illumination device is in this case projected via the projection lens onto a substrate (e.g. a silicon wafer) that is coated with a light-sensitive layer (photoresist) and arranged in the image plane of the projection lens in order to transfer the mask structure to the light-sensitive coating of the substrate.

In projection lenses designed for the EUV range, i.e., at wavelengths of, e.g., approximately 13 nm or approximately 7 nm, mirrors are used as optical components for the imaging process owing to the general lack of availability of suitable light-transmissive refractive materials. In some cases, among other things as a result of absorption of the radiation emitted by the EUV light source, the EUV mirrors can heat up and undergo an associated thermal expansion or deformation, which in turn can negatively affect the imaging properties of the optical system.

To take this effect into account, it is known, among other things, to use a material with ultra-low thermal expansion ("Ultra Low Expansion Material"), for example a titanium silicate glass sold by Corning Inc. with the name ULE™ as the mirror substrate material and to set what is known as the zero-crossing temperature in a region near the optical effective surface. At this zero-crossing temperature, which lies at around $\vartheta=30°$ C. for example for ULE™, the coefficient of thermal expansion has in its temperature dependence a zero crossing in the vicinity of which no thermal expansion or only negligible thermal expansion of the mirror substrate material takes place.

However, in practice the problem arises here that an EUV mirror is exposed during operation of the microlithographic projection exposure apparatus to changing intensities of the incident electromagnetic radiation, including locally, for example due to the use of illumination settings with an intensity that varies over the optical effective surface of the respective EUV mirror, and also temporally, wherein the relevant EUV mirror typically heats up in particular at the beginning of the microlithographic exposure process from a comparatively low temperature to its operating temperature reached in the lithography process.

One approach for overcoming this and in particular for avoiding surface deformations caused by varying introductions of heat into an EUV mirror and associated optical aberrations includes the use of pre-heaters for example on the basis of infrared radiation. With such pre-heaters, active mirror heating can take place in phases of comparatively low absorption of EUV useful radiation, wherein the active mirror heating is correspondingly decreased as the absorption of the EUV useful radiation increases.

Regulation of the operation of such pre-heaters that is performed with the goal of maintaining a mirror temperature that is as constant as possible (typically the above-mentioned zero-crossing temperature) uses knowledge of the radiant power that is incident in each case on the relevant mirror so that the pre-heating power can be adapted accordingly. Temperature sensors that can be attached typically to the mirror's rear side at an appropriate distance from the optical effective surface of the respective mirror are used for this reason (in addition to infrared cameras, which are not always practical for installation space reasons).

However, it can be the case that, due to the radiation absorption taking place in the mirror substrate material predominantly already close to the surface at penetration depths of a few micrometers, the temperature values measured with such temperature sensors are not sufficiently representative of the temperature that ultimately leads to the surface deformation, with the result that regulation that is based solely on the temperature measured by the temperature sensors may react too late and adequate adaptation of the pre-heating power does not occur.

SUMMARY

The present disclosure seeks to provide a method and an apparatus for determining the heating state of a mirror in an optical system, in particular in a microlithographic projection exposure apparatus, which permit more reliable temperature-sensor-based characterization of the heating state.

In an aspect, the disclosure provides a method for determining the heating state of an optical element in an optical system, in particular in a microlithographic projection exposure apparatus, wherein the method includes the following steps: a) measuring values of a first temperature that the optical element has at a first position using a temperature sensor; and b) estimating a second temperature that the optical element has at a second position, which is located at a distance from the first position, on the basis of the values measured in step a), wherein estimating the second temperature in step b) is accomplished while taking into account a temporal change in the values measured in step a).

In an aspect, the disclosure provides an apparatus for determining the heating state of a mirror in an optical system, in particular in a microlithographic projection exposure apparatus, characterized in that the apparatus is configured for performing a method as described in the preceding paragraph.

A method for determining the heating state of an optical element in an optical system, in particular in a microlithographic projection exposure apparatus, includes the following steps:
  measuring values of a first temperature that the optical element has at a first position using a temperature sensor, and
  estimating a second temperature that the optical element has at a second position, which is located at a distance from the first position, on the basis of the measured values, wherein estimating the second temperature is accomplished while taking into account a temporal change in the previously measured values.

The disclosure is based in particular on the concept that, for estimating a searched-for temperature of an optical element, such as a mirror (in particular an average surface temperature of the mirror), by using the temperature values measured at another position of the optical element by at least one temperature sensor, not only these (absolute) temperature values are used but also the temporal gradient of the measured temperature values is taken into account.

This approach is based on the idea that, in an exemplary scenario in which a quick temporal change in temperature values is measured with a temperature sensor arranged at a distance from the optical effective surface of a mirror, the measurement permits the conclusion to be drawn that a significant introduction of heat has already taken place on the incidence surface or on the optical effective surface of the mirror and consequently also that the assumption of a correspondingly higher value for the searched-for average surface temperature—and possibly the adaptation of a regulator setting this target temperature—is justified.

The disclosure in this case also includes the concept that, for example when regulating the pre-heating power of a pre-heater with the objective of maintaining an average mirror temperature that is as constant as possible over time and avoiding mirror deformations and associated aberrations on the basis of temperature values measured in a sensor-based manner, not only these absolute temperature values measured in a sensor-based manner are used as a regulation input variable but that at least also the (at least first) time derivative of the measured temperature is taken into account.

Taking into account the time derivative of the temperature measured in a sensor-based manner (also referred to as "sensor temperature" $T_{Sensor}$ below) when ascertaining the assumed or predicted temperature (also referred to as "prediction temperature" $T_{Prediction}(t)$ below), which is then possibly used as a regulation input variable of a pre-heater or the like, may take place here by taking different functional relationships between the prediction temperature $T_{Prediction}(t)$ and the temperature $T_{Sensor}(t)$ that is measured in a sensor-based manner as a basis: One exemplary approach is, for example $$T_{Prediction}(t) = T_{Sensor}(t) + p\left(\frac{\partial T_{Sensor}}{\partial t}\right)^q \quad (1)$$

wherein p and q represent parameters that are able to be arbitrarily suitably adapted.

In embodiments of the disclosure, estimating the at least one value of the second temperature (i.e. ascertaining of the "prediction temperature" $T_{Prediction}(t)$) can take place by taking into account previously ascertained temporal changes in the values measured in a sensor-based manner (i.e. "the sensor temperature" $T_{Sensor}(t)$).

This approach is based on the further consideration that taking into account the "history" in such a way in addition to taking into account the respectively current temporal temperature gradient, an even more reliable ascertainment of the searched-for prediction temperature $T_{prediction}(t)$ or regulation for example of a pre-heater that is adapted even better is made possible because of the additionally used information. In particular, after all it is possible in this way to consider whether the temporal change in the sensor temperature that has been established and taken into account according to the disclosure takes place in a temperature profile that is comparatively steep over time (due to temporal gradients of the sensor temperature that have already risen strongly in the past) and thus involves for example even stronger post-regulation of a pre-heater.

Even though in the above statements reference was in each case made to regulating a pre-heater as an exemplary application for the prediction temperature that is ascertained according to the disclosure, the disclosure is not limited thereto. In further embodiments, the prediction temperature ascertained according to the disclosure can also be used as an input signal for a different regulation of at least one parameter characterizing the optical element (e.g., the mirror) and/or the respective optical system. Controlling actuators of a deformable mirror for the purposes of compensating a correspondingly thermally induced mirror deformation or regulating other degrees of freedom in the optical system (e.g., controlling substrate stage and/or reticle stage for taking into account any lateral displacements of the optical beam path in the substrate and/or reticle plane) are mentioned here merely as examples.

In some embodiments, prediction according to the disclosure for example of the mirror temperature in different phases of the lithography process may render an actual field-dependent measurement of aberrations of the optical system either dispensable or necessary only at greater time intervals, with the consequence that the throughput attained during lithography operation can ultimately be increased. The ascertainment or prediction according to the disclosure of the mirror temperature can, after all, be used, with the additional use of further known information relating to the respective specific optical system, for predicting a wavefront change during the operation of the optical system, as a result of which in turn a suitable correction mechanism or actuators in the system can be correspondingly controlled or moved.

According to some embodiments, the second position is located on an incidence surface of the optical element for electromagnetic radiation that is incident during the operation of the optical system.

According to some embodiments, the first position is located on a side of the optical element facing away from the incidence surface.

According to some embodiments, the second position is located in an access channel that extends from a side of the optical element facing away from the incidence surface into the optical element.

According to some embodiments, the estimating of the at least one value of the second temperature furthermore takes place by taking into account previously ascertained temporal changes in the previously measured values.

According to some embodiments, the estimated second temperature is used as an input signal for a regulation at least of one parameter characterizing the optical element and/or the optical system.

According to some embodiments, pre-heating of the optical element to at least partially compensate temporal changes in the heating state of the optical element occurring during the operation of the optical system is controlled based on the estimated second temperature.

According to some embodiments, the optical element is a mirror.

In accordance with some embodiments, the optical element is designed for an operating wavelength of less than 30 nm, in particular less than 15 nm.

According to some embodiments, the steps described above are performed during the operation of the microlithographic projection exposure apparatus.

The disclosure furthermore relates to an apparatus for determining the heating state of a mirror in an optical system, in particular in a microlithographic projection exposure apparatus, wherein the apparatus is configured for performing a method having the features described above. With regard to advantages and preferred configurations of the apparatus, reference is made to the above explanations in association with the method according to the disclosure.

Further configurations of the disclosure can be gathered from the description and the claims.

BRIEF DESCRIPTION OF THE DRAWINGS

The disclosure is explained in greater detail below on the basis of exemplary embodiments illustrated in the accompanying figures, in which:

FIGS. 3A, 3B and 4 show diagrams for demonstrating exemplary improvements of the prediction quality that are attainable with a method according to the disclosure when ascertaining the thermal state of a mirror.

DETAILED DESCRIPTION OF EMBODIMENTS

Figure 1:
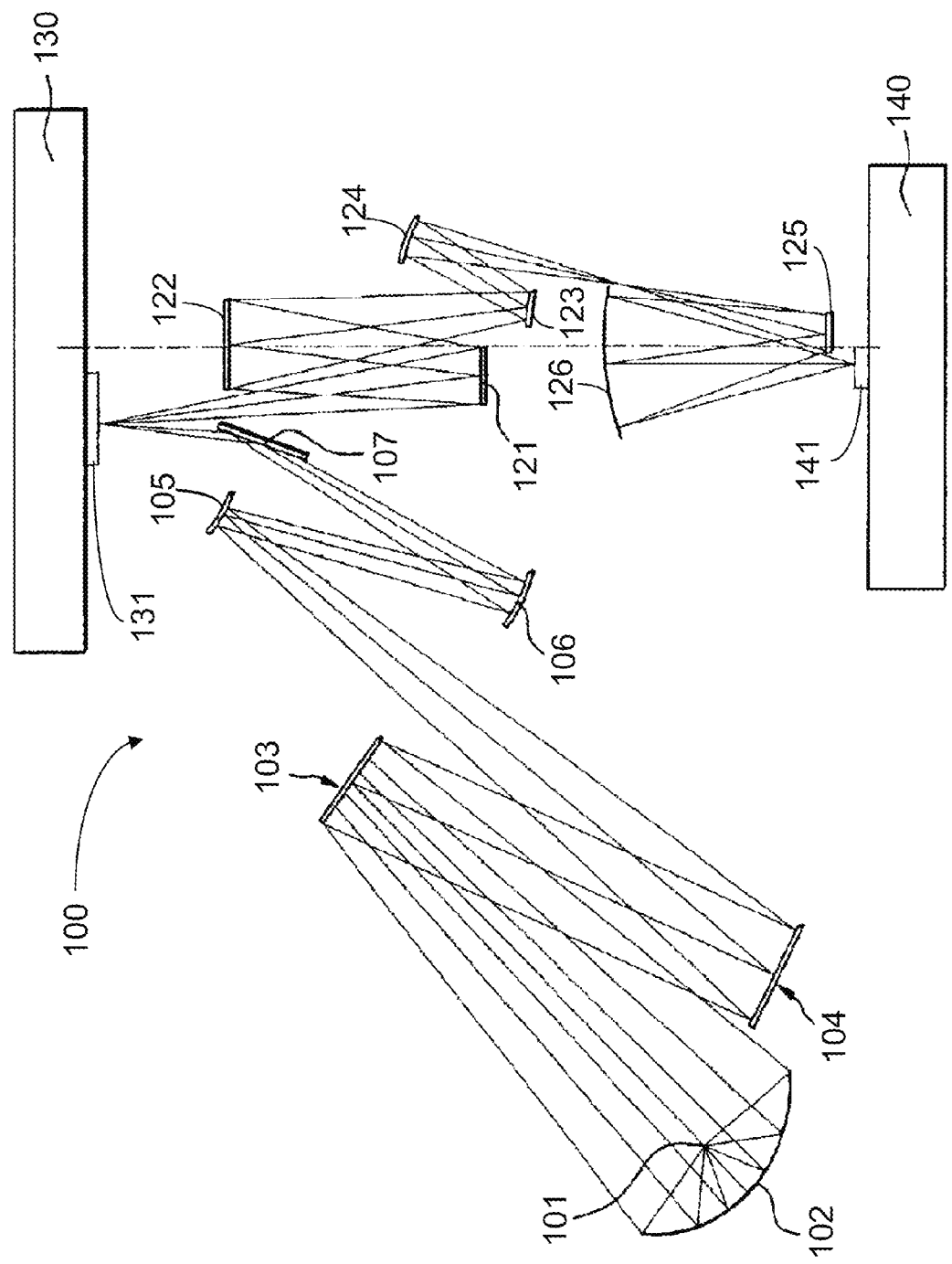
FIG. 1 shows a schematic illustration of the possible construction of a microlithographic projection exposure apparatus designed for operation in the EUV.

FIG. 1 shows a schematic illustration of a projection exposure apparatus 100 which is designed for operation in the EUV range and in which the disclosure is able to be realized in an exemplary manner.

According to FIG. 1, an illumination device of the projection exposure apparatus 100 comprises a field facet mirror 103 and a pupil facet mirror 104. The light from a light source unit comprising in the example an EUV light source (plasma light source) 101 and a collector mirror 102 is directed onto the field facet mirror 103. A first telescope mirror 105 and a second telescope mirror 106 are arranged in the light path downstream of the pupil facet mirror 104. A deflection mirror 107 is arranged downstream in the light path, the deflection mirror directing the radiation that is incident thereon onto an object field in the object plane of a projection lens comprising six mirrors 121-126. At the location of the object field, a reflective structure-bearing mask 131 is arranged on a mask stage 130, the mask being imaged with the aid of the projection lens into an image plane in which a substrate 141 coated with a light-sensitive layer (photoresist) is situated on a wafer stage 140.

The method according to the disclosure for determining the heating state of an optical element can be applied for example to any desired mirror of the microlithographic projection exposure apparatus of FIG. 1.

Figure 2:
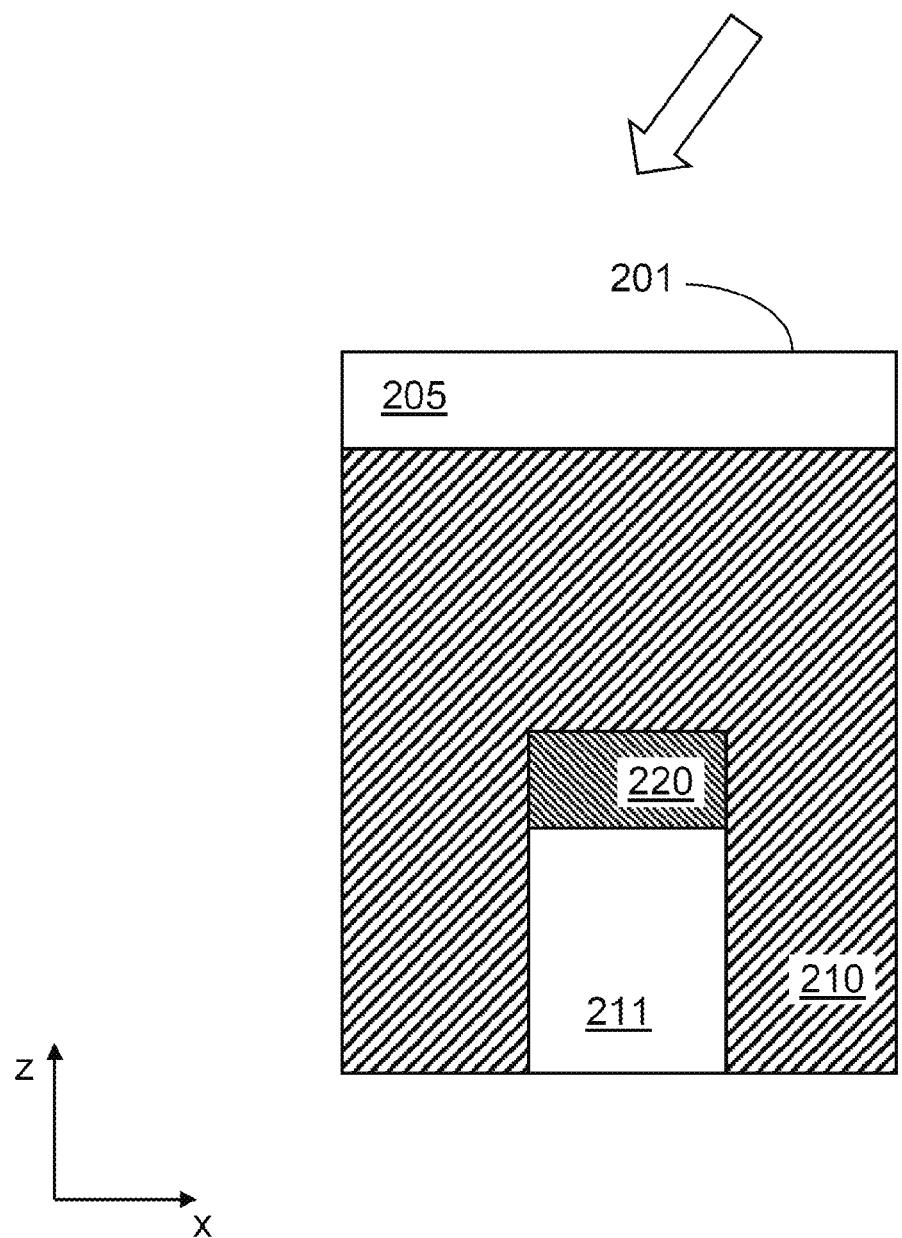
FIG. 2 shows a schematic illustration for explaining the possible construction of a mirror in which the method according to the disclosure can be realized.

FIG. 2 shows, in a merely schematic and highly simplified illustration, the possible construction of a mirror having a mirror substrate 210 (for example made from ULE™) and a reflection layer system 205 (having for example an alternating sequence of molybdenum (Mo) and silicon (Si) layers), wherein the optical effective surface of the mirror is denoted with "201."

During operation of the optical system or the microlithographic projection exposure apparatus, the electromagnetic radiation that is incident on the optical effective surface or incidence surface 201 (indicated by the arrow in FIG. 2) is partially absorbed and, as explained in the introductory part, results in heat being generated and in an associated thermal expansion or deformation, which in turn can lead to an impairment of the imaging properties of the optical system.

With reference to FIG. 2 to FIG. 4, a method according to the disclosure will now be described for correspondingly estimating the heating state of the mirror in question and for possibly correspondingly controlling a suitable correction mechanism (such as pre-heaters described in the introductory part).

According to FIG. 2, a temperature sensor 220 is located in a hole that has been introduced as an access channel 211 into the mirror substrate 210 from the mirror's rear side.

In the text below, $T_{Sensor}(t)$ denotes the temperature measured with the temperature sensor 220, $T_{real}(t)$ denotes the average mirror temperature that actually leads to the surface deformation, and $T_{Prediction}(t)$ denotes the temperature that is assumed proceeding from the sensor signal of the temperature sensor 220 and can serve for example for regulating a pre-heater. Active mirror heating using such a pre-heater can take place in phases of comparatively low absorption of EUV useful radiation as described in the introductory part, wherein the active mirror heating is correspondingly decreased as the absorption of the EUV useful radiation increases.

According to the disclosure, the prediction temperature $T_{Prediction}(t)$ is now determined not directly from the temperature $T_{Sensor}(t)$ measured by the temperature sensor 220 but with additional consideration of the temporal change of the temperature $$\left(\frac{\partial T_{sensor}}{\partial t}\right).$$

In one exemplary embodiment, the following approach for the prediction temperature can be selected:

$$T_{Prediction}(t) = T_{Sensor}(t) + p\left(\frac{\partial T_{Sensor}}{\partial t}\right)^q \qquad (1)$$

In equation (1), both the temperature measured with the temperature sensor 220 (sensor temperature) and the temperature that is present on the optical effective surface 201 of the mirror (as the value for the prediction temperature, e.g. using an infrared camera) can be determined for the suitable selection of the (fit) parameters p and q in a measurement and calibration setup. Then, the values for which equation (1) best describes the results or value pairs ($T_{Prediction}$, $T_{Sensor}$) can be used for the parameters p and q.

In further embodiments, value pairs can also be ascertained for suitably establishing the parameters p, q in equation (1) using a simulation (e.g. an FE simulation).

The disclosure is not limited to the previous approach according to equation (1) for the functional relationship between the temperature $T_{Sensor}(t)$ measured with the temperature sensor 220 and the prediction temperature $T_{Prediction}(t)$. In further embodiments, other approaches or functional relationships in which in each case the temporal change of the temperature values measured with the temperature sensor 220 is taken into account can also be selected. In particular, the following (integral) approach can also be selected:

$$T_{Prediction}(t) = T_{Sensor}(t) + p \int_{-\infty}^{t} d\tau \left( \frac{\partial T_{sensor}}{\partial t} \right)^q e^{-\alpha(t-\tau)} \quad (2)$$

In the integral term given in equation (2), the value of the temporal gradient of the temperature $T_{Sensor}$ measured by the surface sensor 220 is set here in each case at the time point τ (as integration variable). According to equation (2), the previous temporal profile of the temporal gradient of the temperature $T_{Sensor}$ measured with the temperature sensor 220 is summed. In that case, α denotes a further parameter that is present in equation (2) in addition to the parameters p, q and that describes the "forgetting" of respectively earlier contributions in the sense of a decay constant.

Also taking into consideration the previous time profile of the temporal gradient of $T_{Sensor}$ in accordance with equation (2) makes it possible to take into consideration the (e.g. exponential) temporal profile of the temperature via the additional information provided to this extent and for example to take account of the presence of a comparatively steep increase by way of a correspondingly strong post-regulation (in the sense of overdrive).

Figure 3A:
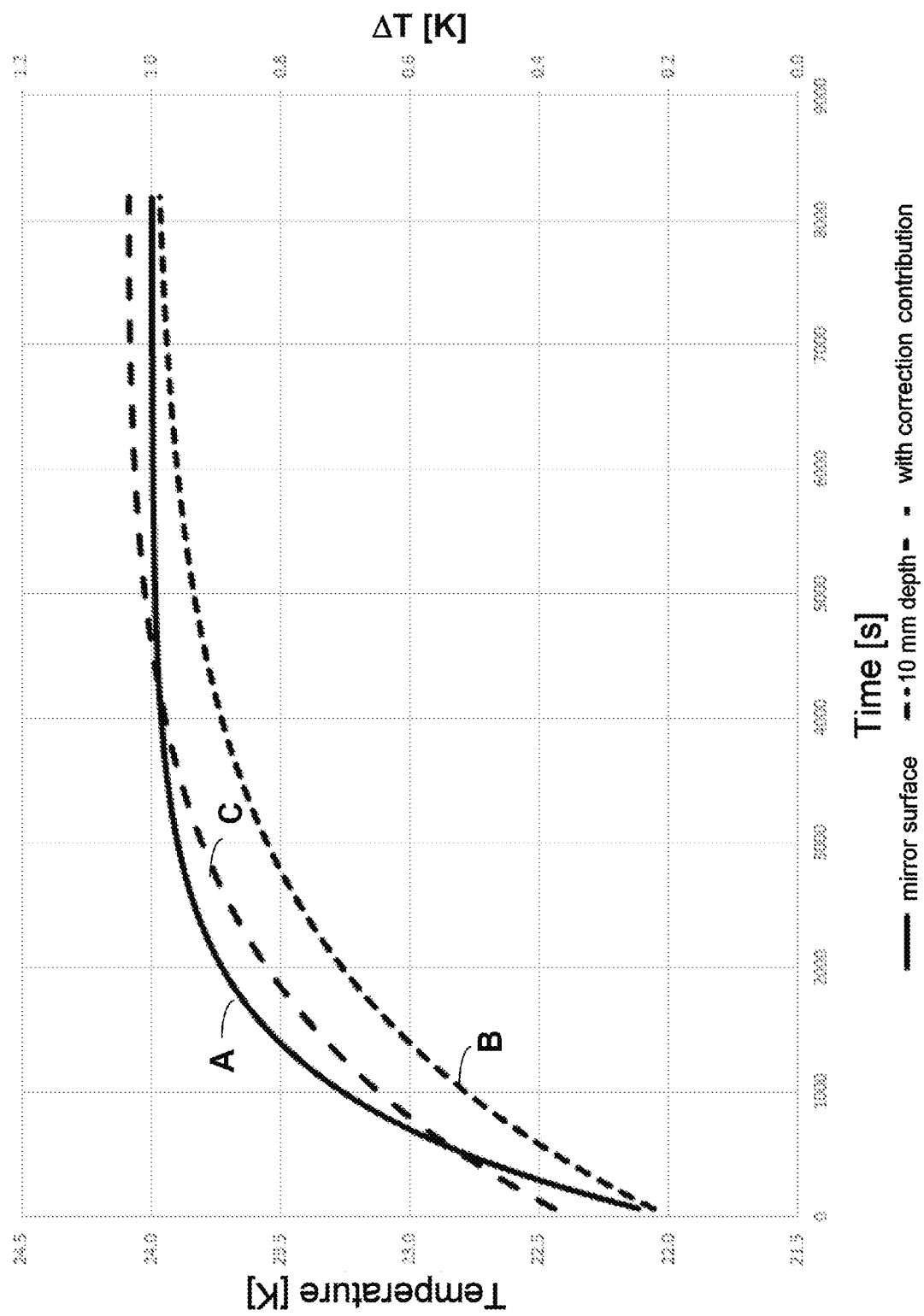
Figure 3B:
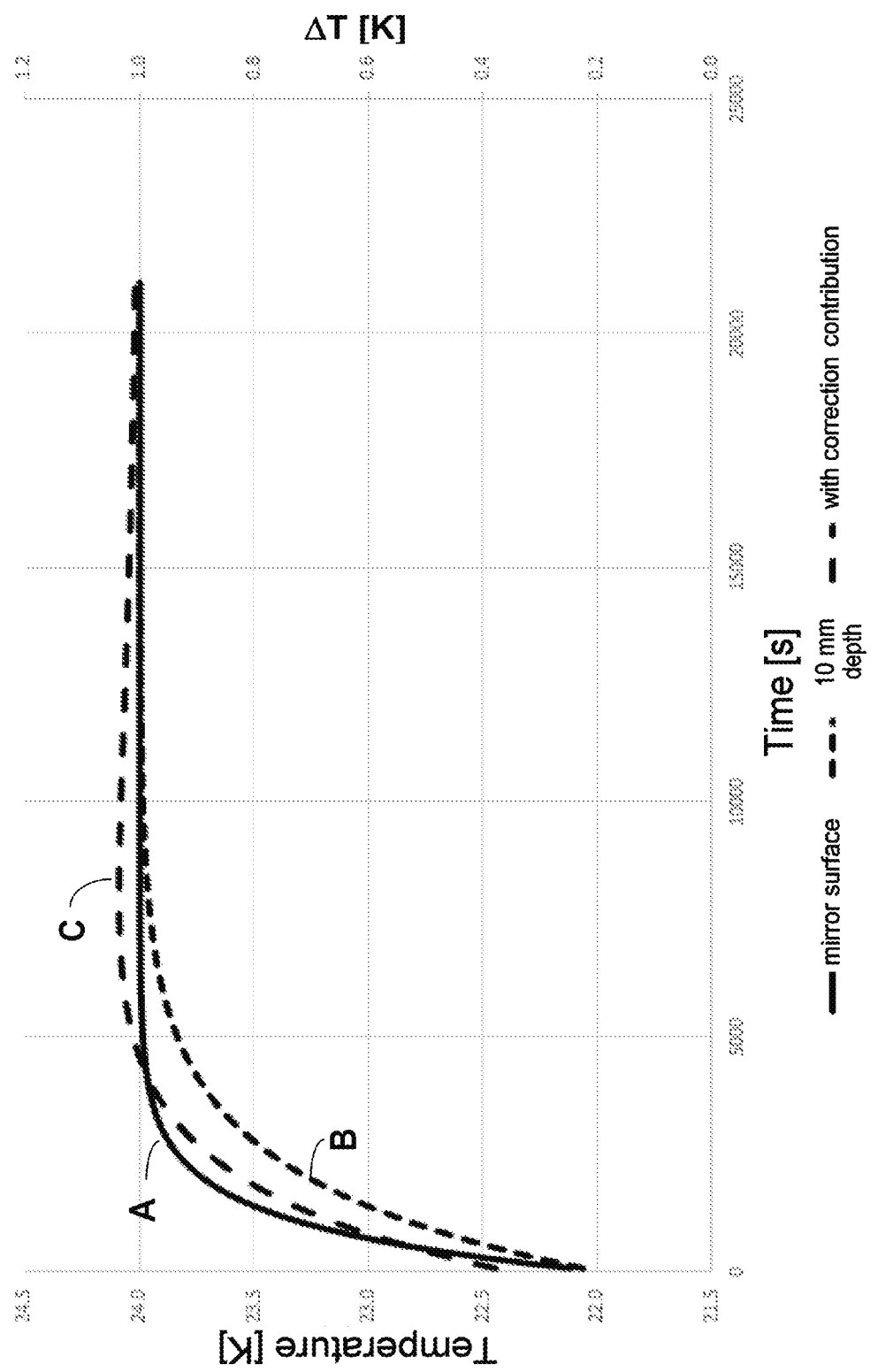

FIGS. 3A and 3B serve to demonstrate the improvement in the prediction quality that is attainable in the method according to the disclosure on the basis of a simplified model for the temporal profile of the temperature.

Here, curve "A" describes the temporal profile of the temperature on the optical effective surface 201 or the mirror surface, curve "B" describes the temporal profile of the temperature in the mirror material at a depth of 10 mm, and curve "C" describes the temporal profile of the temperature obtained according to the disclosure based both on the relevant "depth information" (that is to say for example the absolute temperature measured at the relevant depth with a corresponding temperature sensor) and on the "correction contribution" taken into account according to the disclosure (that is to say the temporal change of the temperature that is measured in the depth in a sensor-based manner).

As can be seen from FIGS. 3A and 3B, the curve "C" obtained on the basis of the correction contribution according to the disclosure describes the temperature that is actually present on the mirror surface according to curve "A" significantly better in particular in the "starting phase" than curve "B." The smaller diagram in FIG. 3B over a larger time period furthermore shows that the curve "C" also ultimately converges to the correct temperature value.

FIG. 4 shows a diagram for illustrating a further improvement of the prediction quality that is possible according to the disclosure with the "history" taken into account for example by using the approach described above on the basis of equation (2).

Curve "D" here describes the temporal profile of the temperature error or of the deviation of the temperature predicted solely from the sensor signal of the temperature sensor 220 from the temperature that is actually present on the mirror surface. Curve "E" describes the temporal profile of the corresponding temperature error in the case in which the prediction temperature is ascertained according to the disclosure while taking into account the temporal gradient of the sensor signal (for example according to equation (1)), and curve "F" describes the temporal profile of the corresponding temperature error with the "history" additionally being taken into account when the prediction temperature is ascertained for example according to the approach of equation (2).

It can be seen that by additionally taking account of the history (that is to say of the previous time profile of the temporal gradient of $T_{Sensor}$), a further improvement of the prediction quality is attained.

Even though the disclosure has been described on the basis of specific embodiments, numerous variations and alternative embodiments will be apparent to the person skilled in the art, for example through combination and/or exchange of features of individual embodiments. Accordingly, it goes without saying for the person skilled in the art that such variations and alternative embodiments are also encompassed by the present disclosure, and the scope of the disclosure is restricted only within the meaning of the appended patent claims and the equivalents thereof.

What is claimed is:

1. A method of estimating a temperature of an incidence surface of an optical element in a microlithographic projection exposure apparatus, the optical element comprising a substrate supporting the incidence surface, the optical element having a channel extending into the substrate from a side of the optical element facing away from the incidence surface, the channel having a channel surface located a distance from the incidence surface, the method comprising:
    a) using a temperature sensor to measure values of a temperature of the channel surface, the temperature sensor being in direct contact with the channel surface; and
    b) based on the values measured in a) and taking into account a temporal change in the values measured in a), estimating the temperature of the incidence surface,
    wherein during use of the optical element, electromagnetic radiation impinges on the incidence surface, and
    wherein estimating the temperature of the incidence surface comprises using an equation which comprises the term $$p \left( \frac{\partial T_{Sensor}}{\partial t} \right)^q,$$

and wherein $T_{sensor}$ is a temperature value measured by the temperature sensor, t is time, and p and q are fit parameters.

2. The method of claim 1, wherein the optical element is in an illumination system of the microlithographic projection exposure apparatus.

3. The method of claim 1, wherein the channel surface faces away from the incidence surface.

4. The method of claim 1, wherein estimating the temperature during b) comprises taking into account previously ascertained temporal changes in the values measured in a).

5. The method of claim 1, further comprising using the temperature estimated in b) as an input signal to regulate a parameter that characterizes the optical element.

6. The method of claim 1, further comprising using the temperature estimated in b) to control pre-heating of the optical element to at least partially compensate temporal changes in the heating state of the optical element occurring during use of the optical element.

7. The method of claim 1, wherein the optical element is a mirror.

8. The method of claim 7, wherein, during use of the optical element, the electromagnetic radiation that impinges on the incidence surface has an operating wavelength of less than 30 nm.

9. The method of claim 1, wherein, during use of the optical element, the electromagnetic radiation that impinges on the incidence surface has an operating wavelength of less than 30 nm.

10. The method of claim 1, wherein:
the channel surface faces away from the incidence surface; and
estimating the temperature during b) comprises taking into account previously ascertained temporal changes in the values measured in a).

11. A method of estimating a temperature of an incidence surface of an optical element in a microlithographic projection exposure apparatus, the optical element comprising a substrate supporting the incidence surface, the optical element having a channel extending into the substrate from a side of the optical element facing away from the incidence surface, the channel having a channel surface located a distance from the incidence surface, the method comprising:
a) using a temperature sensor to measure values of a temperature of the channel surface, the temperature sensor being in direct contact with the channel surface; and
b) based on the values measured in a) and taking into account a temporal change in the values measured in a), estimating the temperature of the incidence surface,
wherein during use of the optical element, electromagnetic radiation impinges on the incidence surface), and
wherein estimating the temperature of the incidence surface comprises using an equation which comprises the term $$p \int_{-\infty}^{t} d\tau \left( \frac{\partial T_{Sensor}}{\partial t} \right)^{q} e^{-\alpha(t-\tau)},$$

and wherein $T_{sensor}$ is a temperature value measured by the temperature sensor, t is time, $\tau$ is a point in time, $\alpha$ represents a decay constant, and p and q are fit parameters.

12. The method of claim 11, wherein the optical element is in an illumination system of the microlithographic projection exposure apparatus.

13. The method of claim 11, wherein the channel surface faces away from the incidence surface.

14. The method of claim 11, wherein estimating the temperature during b) comprises taking into account previously ascertained temporal changes in the values measured in a).

15. The method of claim 11, further comprising using the temperature estimated in b) as an input signal to regulate a parameter that characterizes the optical element.

16. The method of claim 11, further comprising using the temperature estimated in b) to control pre-heating of the optical element to at least partially compensate temporal changes in the heating state of the optical element occurring during use of the optical element.

17. The method of claim 11, wherein the optical element is a mirror.

18. The method of claim 17, wherein, during use of the optical element, the electromagnetic radiation that impinges on the incidence surface has an operating wavelength of less than 30 nm.

19. The method of claim 11, wherein, during use of the optical element, the electromagnetic radiation that impinges on the incidence surface has an operating wavelength of less than 30 nm.

20. The method of claim 11, wherein:
the channel surface faces away from the incidence surface; and
estimating the temperature during b) comprises taking into account previously ascertained temporal changes in the values measured in a).

* * * * *